US006081987A

United States Patent [19]

Kalsi et al.

[11] Patent Number: 6,081,987

[45] Date of Patent: Jul. 4, 2000

[54] METHOD OF MAKING FAULT CURRENT LIMITING SUPERCONDUCTING COIL

[75] Inventors: Swarn S. Kalsi; Gregory L. Snitchler, both of Shrewsbury, Mass.; Jeffrey M. Seuntjens, Bangau, Singapore

[73] Assignee: American Superconductor Corporation, Westborough, Mass.

[21] Appl. No.: 09/301,488

[22] Filed: Apr. 28, 1999

Related U.S. Application Data

[63] Continuation of application No. 08/928,901, Sep. 12, 1997.

[51] Int. Cl.[7] .......... H01L 39/24

[52] U.S. Cl. .......... 29/599; 29/605; 505/211; 505/705

[58] Field of Search .......... 29/599, 605, 609; 505/211, 213, 705

[56] References Cited

U.S. PATENT DOCUMENTS 4,939,444 7/1990 Cacheux .
5,138,626 8/1992 Edwards et al. .
5,231,074 7/1993 Cima et al. .
5,387,891 2/1995 Nick .
5,525,583 6/1996 Alzed et al. .
5,581,220 12/1996 Rodenbush et al. .
5,604,473 2/1997 Rodenbush .
5,659,277 8/1997 Joshi et al. .
5,912,607 6/1999 Kalsi et al. .
5,914,647 6/1999 Alzed et al. .

FOREIGN PATENT DOCUMENTS 41 32 067 A1 5/1992 Germany .

*Primary Examiner*—Carl J. Arbes
*Attorney, Agent, or Firm*—Fish & Richardson P.C.

[57] ABSTRACT

A superconducting magnetic coil includes a first superconductor formed of an anisotropic superconducting material for providing a low-loss magnetic field characteristic for magnetic fields parallel to the longitudinal axis of the coil and a second superconductor having a low loss magnetic field characteristic for magnetic fields perpendicular to the longitudinal axis of the coil. The first superconductor has a normal state resistivity characteristic conducive for providing current limiting in the event that the superconducting magnetic coil is subjected to a current fault.

26 Claims, 3 Drawing Sheets

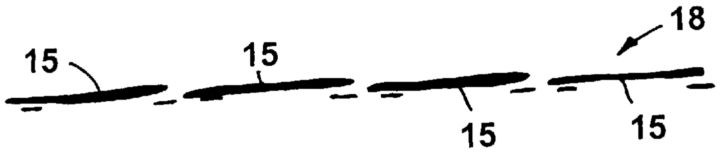
FIG. 3
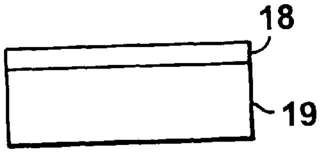
FIG. 4
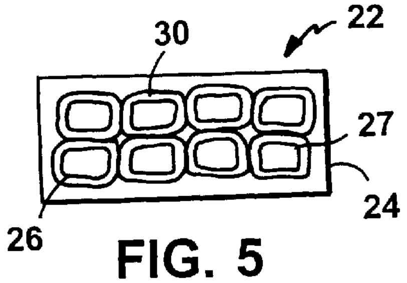
FIG. 5
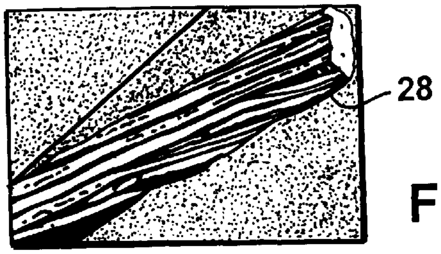
FIG. 6
FIG. 7
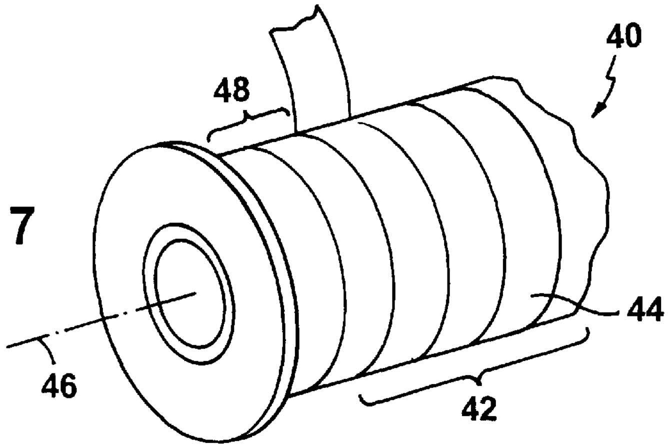
FIG. 8
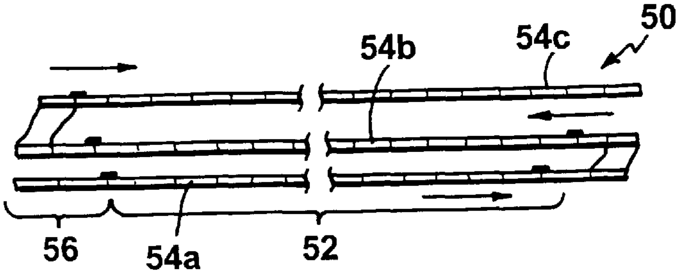

METHOD OF MAKING FAULT CURRENT LIMITING SUPERCONDUCTING COIL

CROSS REFERENCE TO RELATED APPLICATION

This application is a continuation of U.S. application Ser. No. 08/928,901, filed Sep. 12, 1997.

BACKGROUND OF THE INVENTION

The invention relates to superconducting magnetic coils.

An important property of a superconductor is the disappearance of its electrical resistance when it is cooled below a critical temperature $T_c$. Below $T_c$ and for a given superconductor, there exists a maximum amount of current—referred to as the critical current ($I_c$) of the superconductor—which can be carried by the superconductor at a specified magnetic field and temperature. Any current in excess of $I_c$ causes the onset of resistance in the superconductor. If the superconductor is embedded in or co-wound with a conductive matrix, any incremental current above $I_c$ will be shared between the superconductor and matrix material based on the onset of resistance in the superconductor.

Superconducting materials are generally classified as either low or high temperature superconductors. High temperature superconductors (HTS), such as those made from ceramic or metallic oxides are typically anisotropic, meaning that they generally conduct better, relative to the crystalline structure, in one direction than another. Moreover, it has been observed that, due to this anisotropic characteristic, the critical current varies as a function of the orientation of the magnetic field with respect to the crystallographic axes of the superconducting material. Anisotropic high temperature superconductors include, but are not limited to, the family of Cu—O-based ceramic superconductors, such as members of the rare-earth-copper-oxide family (YBCO), the thallium-barium-calcium-copper-oxide family (TBCCO), the mercury-barium-calcium-copper-oxide family (HgBCCO), and the bismuth strontium calcium copper oxide family (BSCCO). These compounds may be doped with stoichiometric amounts of lead or other materials to improve properties (e.g., $(Bi,Pb)\ _2Sr_2Ca_2Cu_3O_{10}$).

Anisotropic high temperature superconductors are often fabricated in the form of a superconducting tape having a relatively high aspect ratio (i.e., width greater than the thickness). The thin tape is fabricated as a multi-filament composite superconductor including individual superconducting filaments which extend substantially the length of the multi-filament composite conductor and are surrounded by a matrix-forming material (e.g., silver). The ratio of superconducting material to matrix-forming material is known as the "fill factor" and is generally less than 50%. Although the matrix forming material conducts electricity, it is not superconducting. Together, the superconducting filaments and the matrix-forming material form the multi-filament composite conductor.

High temperature superconductors may be used to fabricate superconducting magnetic coils such as solenoids, racetrack magnets, multiple magnets, etc., in which the superconductor is wound into the shape of a coil. When the temperature of the coil is sufficiently low that the HTS conductor can exist in a superconducting state, the current carrying capacity as well as the magnitude of the magnetic field generated by the coil is significantly increased.

High temperature superconductors have been utilized as current limiting devices to limit the flow of excessive current in electrical systems caused by, for example, short circuits, lightning strikes, or common power fluctuations. HTS current limiting devices may have a variety of different configurations including resistive and inductive type current limiters.

SUMMARY OF THE INVENTION

The invention features a superconducting magnetic coil having a first superconductor formed of an anisotropic superconducting material for providing a low-loss magnetic field characteristic for magnetic fields parallel to the longitudinal axis of the coil and a second superconductor having a low loss magnetic field characteristic for magnetic fields perpendicular to the longitudinal axis of the coil (e.g., when the orientation of an applied magnetic field is perpendicular to the wider surface of a superconductor tape, as opposed to when the field is parallel to this wider surface).

In embodiments, the first superconductor has a normal state resistivity characteristic conducive for providing current limiting in the event that the superconducting magnetic coil is subjected to a current fault.

In a general aspect of the invention, the first superconductor is wound about the longitudinal axis of the coil and is formed of an anisotropic superconducting material having a first resistivity characteristic in a normal state of operation; and a second superconductor, wound about the longitudinal axis of the coil and connected to the first anisotropic superconductor, having a second resistivity characteristic, in a normal state of operation, less than the resistivity characteristic of the first anisotropic superconductor in a normal state of operation.

Among other advantages, the first superconductor has a resistivity characteristic such that, should it lose its superconducting properties (e.g., due to an increase in current) and revert back to its normally conducting state, the first superconductor resistively limits current flowing through the coil, thereby preventing damage to itself, the second superconductor, and other components connected to the superconducting magnetic coil. Thus, in one application, the superconducting magnetic coil provides reliable protection in the event of a current fault by limiting the current flowing through the coil for a time period sufficient to allow a circuit breaker to be activated or fuse to be blown, thereby preventing further current flow and potentially catastrophic damage to the superconducting magnetic coil and other components of the system. During normal superconducting operation, the coil has a low loss allowing greater current handling capability.

In another aspect of the invention, a first anisotropic superconductor is wound about the longitudinal axis of the coil and is formed as a superconducting tape, the first anisotropic superconductor configured to provide a low AC loss characteristic in the presence of magnetic fields parallel to the wide surface of the superconductor tape; and a second superconductor, different from the first anisotropic superconductor. The second superconductor is wound about the longitudinal axis of the coil and is connected to an end of the first anisotropic superconductor and configured to provide a low AC loss characteristic in the presence of magnetic fields perpendicular to the wide surface of the superconductor tape of the first anisotropic superconductor.

Embodiments of the above described aspects of the invention may include one or more of the following features.

The second superconductor is connected to an end of the first anisotropic superconductor and is configured to provide a low AC loss characteristic in the presence of perpendicular magnetic fields. The second superconductor is an anisotropic material and is in the form of a tape.

The first anisotropic superconductor is in monolithic form (i.e., in the form of a monofilament or a group of closely spaced multifilaments that are electrically fully coupled to each other, thus acting as a monofilament). Alternatively, the monolithic-form first anisotropic superconductor tape includes a multifilament composite superconductor having individual superconducting filaments which extend the length of the multifilament composite superconductor. The multifilament composite superconductor has a resistivity characteristic, in its normal state, in a range between about 0.1 to 100 $\mu\Omega$-cm, preferably 5 to 100 $\mu\Omega$-cm.

The first anisotropic superconductor can also be in the form of a superconductor tape and generally has an aspect ratio in a range between about 5:1 and 1000:1. The first anisotropic superconductor may include a backing strip formed of a thermal stabilizer having a resistivity characteristic greater than about 1 $\mu\Omega$-cm.

The second anisotropic superconductor can be a tape having multifilament composite superconductor with individual superconducting filaments which extend the length of the multifilament composite superconductor and are surrounded by a matrix forming material.

The first and second anisotropic superconductors may be wound in a layered configuration. Alternatively, the first and second anisotropic superconductors are formed of single or double pancake coils, each coil electrically connected to an adjacent coil.

In an alternative embodiment, the first and second anisotropic superconductors are wound in a "spliced arrangement". With this arrangement, a first segment of the first anisotropic superconductor extends along the longitudinal axis in a first direction toward the second anisotropic superconductor and connects to a first end of a first segment of the second anisotropic superconductor at a first junction. A second end of the first segment is connected to a second segment of the first anisotropic superconductor, the second segment extending along the longitudinal axis in second direction way from the second anisotropic superconductor.

The first and second anisotropic superconductors are high temperature superconductors.

In certain embodiments, the second superconductor constitutes a portion of the total amount of superconductor of the coil in a range between about 5% and 30%, for example, 10%.

Other advantages and features will become apparent from the following description and the claims.

BRIEF DESCRIPTION OF THE DRAWING

FIG. 3 is a side view of the superconductor tape associated with a central region of the superconducting coil of FIG. 1.

FIG. 4 is a side view of the superconductor tape of FIG. 3 having a laminated thermal backing layer.

FIG. 5 is a cross-sectional view of a multifilament composite conductor associated with end regions of the superconducting coil of FIG. 1.

FIG. 6 is an enlarged perspective view of a multistrand cable for the multifilament composite conductor of FIG. 5.

FIG. 7 is a perspective view of an alternative superconducting coil of the invention.

FIG. 8 is a cross-sectional side view of a portion of an another superconducting coil of the invention.

DESCRIPTION

Figure 1:
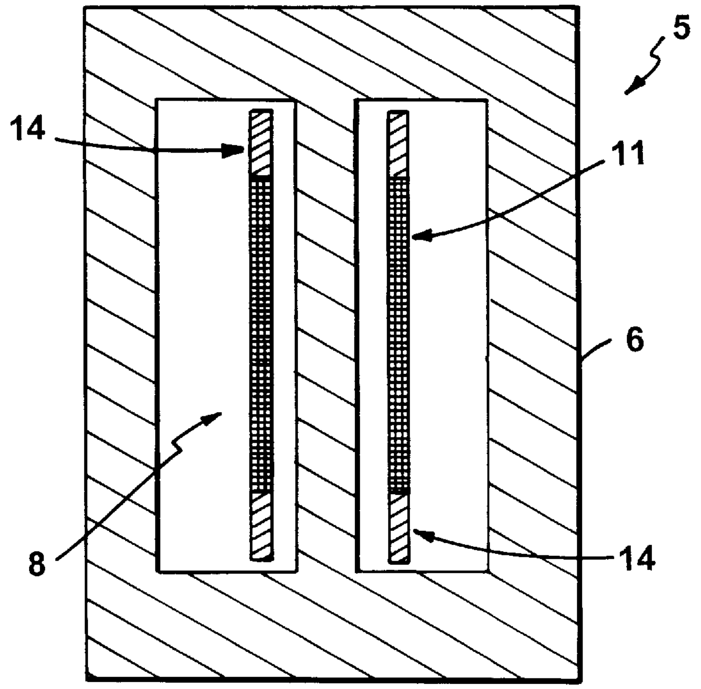
FIG. 1 is a cross-sectional side view of a superconducting coil of the invention having "pancake" coils.

Referring to FIG. 1, a mechanically robust, high-performance superconducting coil assembly 5 includes an iron core 6 and a superconducting coil 8 having a central region 11 and end regions 14. As will be discussed in greater detail below, the superconductor material used to form central region 11 has characteristics different than that used to form end regions 14. In particular, central region 11 is formed with a conductor 18 (FIG. 3) having a low loss characteristic in its superconducting state, but in its normal state has a relatively high resistivity characteristic, so that central region 11 serves as a current limiting section of coil assembly 10. Thus, in the event of an electrical current fault, conductor 18 reverts to its normal, non-superconducting, state for a time sufficient to prevent coil assembly 10 from being damaged due to overheating. During the time that current is being limited by conductor in its normal state, a circuit breaker or fuse can be used to open the circuit and prevent further current flow.

End regions 14 are formed of a conductor 22 (FIG. 5) which, unlike conductor 18 of central region 11, is configured to provide a low AC loss characteristic in the presence of perpendicular magnetic fields. Conductor 22 is configured in this manner because magnetic field lines emanating from superconducting magnetic coil assembly 10 at end regions 14 become perpendicular with respect to the plane of conductor 22 (the conductor plane being parallel to the wide surface of the superconductor tape) causing the critical current density at these regions to drop significantly. In fact, the critical current reaches a minimum when the magnetic field is oriented perpendicularly with respect to the conductor plane.

Figure 2:
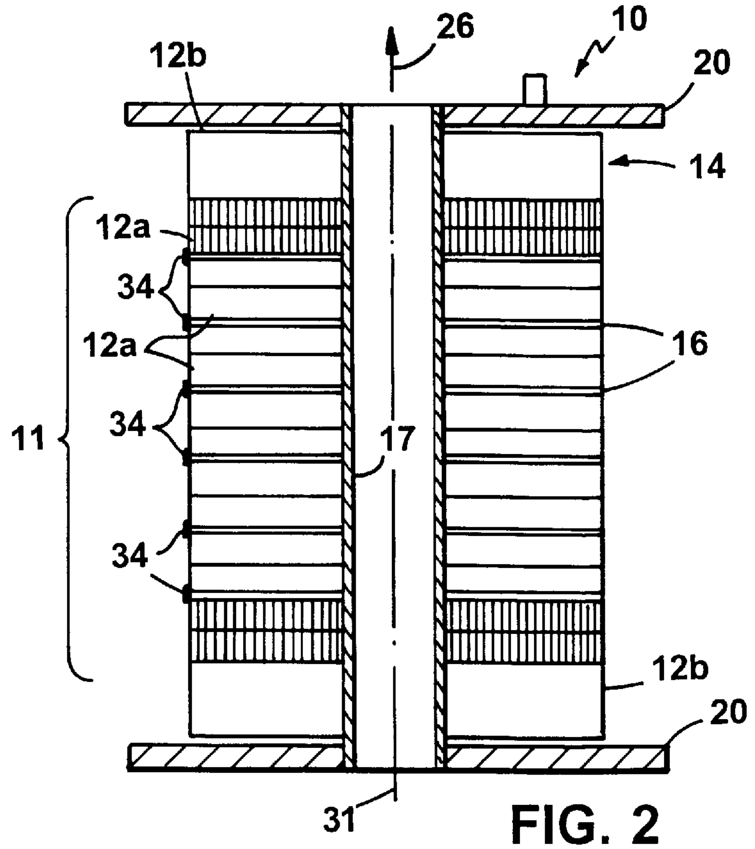
FIG. 2 is a cross-sectional side view of the superconducting coil of FIG. 1 having "pancake" coils.

Referring to FIG. 2, in one embodiment, a superconducting coil 10 includes central region 11 and end region 14 formed with interconnected double "pancake" coils 12*a*, 12*b*. Central region 11 is shown here having seven separate double pancake sections 12*a* and each end region 14 is shown having a single pancake section 12*b*. Each double "pancake" coil 12*a*, 12*b* has co-wound superconductors wound in parallel which are then stacked coaxially on top of each other, with adjacent coils separated by a layer of insulation 16.

An inner support tube 17 supports the coils of central region 11 and end regions 14 with end members 20 attached to opposite ends of inner support tube 17 to compress the coils of central region 11 and end regions 14. Inner support tube 17 and end members 20 are fabricated from an electrically insulative, non-magnetic material, such as aluminum or plastic (for example, G-10).

Referring to FIG. 3, each double pancake coil 12*a* of conductor 18 is fabricated from an HTS anisotropic superconductor formed in the shape of a thin tape which allows the conductor to be bent around relatively small diameters and allows the winding density of the coil to be increased. A method of fabricating double pancake superconducting coils with superconducting tape of this type is described U.S. Pat. No. 5,531,015, assigned to the present assignee, and incorporated herein by reference. Conductor 18 is relatively long and has a relatively large aspect ratio in a range between about 5:1 and 1000:1. For superconductor tapes formed from the BSCCO family, the aspect range is generally between about 5:1 and 20:1 while for tapes formed from YBCO family, the aspect range is generally between about 100:1 and 1000:1, typically about 400:1. Conductor 18 is in monolithic form, meaning that the HTS anisotropic superconductor is in the form of a monofilament 15 or a group of closely spaced multifilaments which are electrically fully coupled to each other and act as a monofilament. The monolithic form conductor 18 is not affected in the same manner as conductor 22 at end regions 14 and provides a relatively low AC loss characteristic because the magnetic fields are substantially parallel along the axis of central region 11.

The monolithic form conductor 18 may be a rare-earth-copper-oxide family (YBCO) material such as those described in U.S. Pat. No. 5,231,074 to Cima et al., entitled "Preparation of Highly Textured Oxide Superconducting Films from MOD Precursor Solutions" which is hereby incorporated by reference. Alternatively, conductor 18 may be formed of other Cu—O-based ceramic superconductors, such as bismuth strontium calcium copper oxide family (BSCCO) which is typically in the form of a composite of individual superconducting filaments surrounded by a matrix forming material. A description of such composite superconducting tapes is described in U.S. Pat. No. 5,531, 015.

Referring to FIG. 4, conductor 18 is laminated onto a thermal stabilizing backing strip 19 formed, for example, of stainless steel, nickel or other suitable alloy. Because resistive heating in conductor 18 can be high, backing strip 19 serves as a heat sink to maintain the temperature of conductor 18 within a safe level while also providing a high resistance path for current flowing through coil assembly 10. Backing strip 19 has a resistivity characteristic greater than about 10 $\mu\Omega$-cm. When conductor 18 is formed of YBCO material, substantially all of the current flows through backing strip 19. On the other hand, where a composite superconductor material is used (e.g., formed of BSCCO) current can also flow through the matrix material of the composite which has a resistivity characteristic in a range between about 0.1 to 100 $\mu\Omega$-cm.

End regions 14 are also formed of a high-temperature superconductor, but of a material different from that used to wind central region 11. Although isotropic superconductor materials may be used, in many applications, anisotropic superconductors, such as BSCCO type composite superconductor are preferred.

Referring to FIGS. 5 and 6, end regions 14 do not have a monolithic form. Rather, conductor 22 is a thin tape 24 fabricated of a multi-filament composite superconductor having individual superconducting filaments 27 which extend substantially the length of the multi-filament composite conductor and are surrounded by a matrix-forming material 28, typically silver or another noble metal. In other embodiments, aspected multifilament strands can be combined and are preferably twisted, for example, in the manner shown in the illustration of a multistrand cable 28 (FIG. 6). Twisting the individual multifilament strands and separating them with a matrix material having a high resistivity characteristic is important for providing the low AC loss characteristic in the presence of perpendicular magnetic fields. Details relating to the types of superconductors and their methods of fabrication suitable for use in forming conductor 22 are described in co-pending application Ser. No. 08/444, 564 filed on May 19, 1995 by G. L. Snitchler, G. N. Riley, Jr., A. P. Malozemoff and C. J. Christopherson, entitled "Novel Structure and Method of Manufacture for Minimizing Filament Coupling Losses in Superconducting Oxide Composite Articles", assigned to the assignee of the present invention, and incorporated by reference. Other superconductors and their methods of fabrication are also described in co-pending application Ser. No. 08/554,814 filed on Nov. 7, 1995 by G. L. Snitchler, J. M. Seuntjens, W. L. Barnes and G. N. Riley, entitled "Cabled Conductors Containing Anisotropic Superconducting Compounds and Method for Making Them", assigned to the assignee of the present invention, and incorporated by reference. Ser. No. 08/719,987, filed Sep. 25, 1996, entitled "Decoupling of Superconducting Filaments in High Temperature Superconducting Composites," assigned to the assignee of the present invention, and incorporated by reference also describes methods of manufacturing superconducting wires well suited for conductor 22.

In certain applications, the superconducting filaments and the matrix-forming material are encased in an insulating layer 30. When the anisotropic superconducting material is formed into a tape, the critical current is often lower when the orientation of an applied magnetic field is perpendicular to the wider surface of the tape, as opposed to when the field is parallel to this wider surface. Conductor 22 of end regions 14 has a resistivity characteristic, in its normal state, less than that of conductor 18 of central region 11.

Referring again to FIG. 2, electrical connections consisting of short lengths of conductive metal 34, such as silver to join or splice the individual coils together in a series circuit. The individual coils can also be connected using conductive solder. In certain applications the short lengths of splicing material can be formed of superconducting material. A length of superconducting material (not shown) also connects one end of coil assembly to a termination post located on end member 20 in order 10 to supply current to coil assembly 10. The current is assumed to flow in a counter-clockwise direction with the magnetic field vector 26 being generally normal to end member 18 (in the direction of longitudinal axis 31) which forms the top of coil assembly 10.

Although the embodiment described above in conjunction with FIG. 2 utilizes pancake type coils, other winding arrangements are within the scope of the claims. For example, referring to FIG. 7, a superconducting coil 40 includes a central region 42 wound with a tape 44 formed of an anisotropic superconductor material in layered arrangement. In a layered arrangement, tape 44 is wound along a longitudinal axis 46 of coil 40 from one end of coil 40 with successive windings wound next to the preceding winding until the opposite end of coil 40 is reached, thereby forming a first layer of the coil. Tape 44 is then wound back along axis 46 in the opposite direction and over the first layer of the coil. This winding approach is repeated until the desired number of turns is wound onto coil 40. End regions 48 may be wound as a single or double pancake coil in the manner described above in conjunction with FIG. 2, or can be wound in a layered arrangement. End regions 48 are connected to central region 42 using metal or solder connections.

Referring to FIG. 8, in another embodiment, a superconducting coil 50 includes a central region 52 formed of high temperature anisotropic superconducting material wound in a layered arrangement. However, unlike coil 40 of FIG. 3, central region 50 is formed of individual lengths **54*a*, 54*b*, 54*c* of high temperature anisotropic superconducting material. Each length 54*a*, 54*b*, 54*c* is spliced (e.g., using solder or conductive metal joints) at end regions 56 to corresponding lengths 58***a*, 58*b*, 58*c* of high temperature anisotropic superconducting material having the lower current density conductor.

Figure 9:
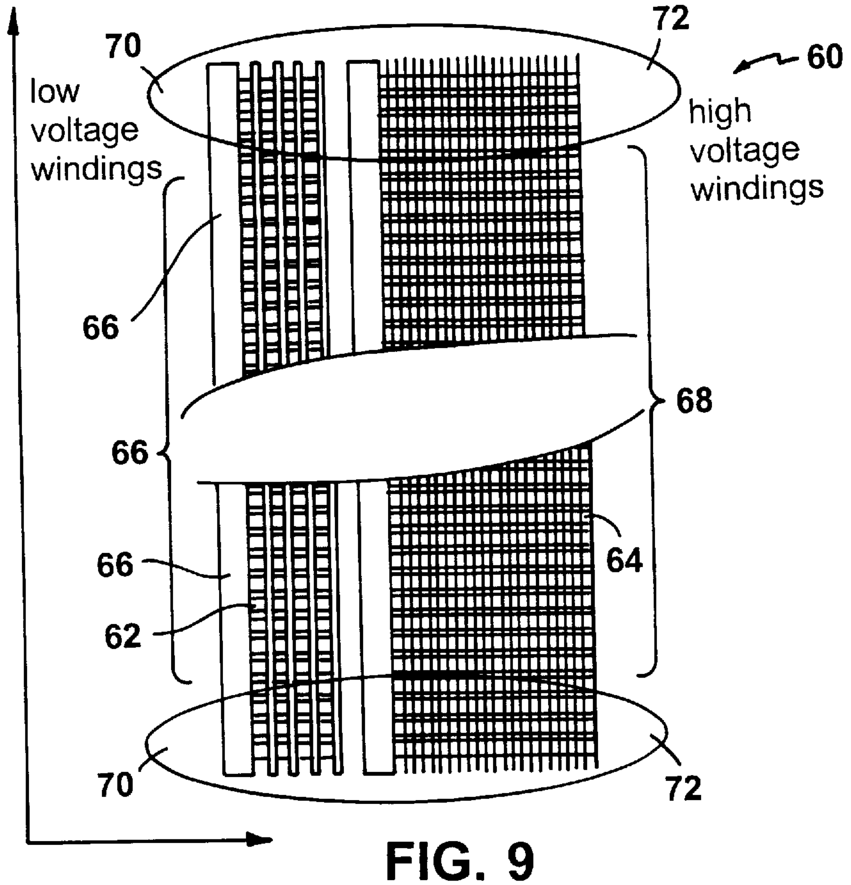
FIG. 9 is a cross-sectional side view of a portion of a transformer having a superconducting coil of the invention.

Referring to FIG. 9, a superconducting transformer 60 includes a low voltage (high current) coil 62 and a high voltage (low current) coil 64, each wound around iron cores (not shown) and on polymer tube mandrels 66. In this embodiment, low voltage coil 62 has four layers while high voltage coil has 20 layers. Each coil 62, 64 is contained within a cryogenic vessel (not shown) containing liquid nitrogen with the iron cores maintained at room temperature so that heat generated by the power dissipated in the cores is not transferred into the cryogenic vessel. In conjunction with the description above, both low voltage coil 62 and high voltage coil 64 include central region 66, 68 for providing current limiting, as well as end regions 70, 72, respectively, for maintaining a low AC loss performance in the presence of perpendicular magnetic fields at the end regions.

Depending on the particular application, each transformer design may have a different arrangement of superconductors used for central regions 66, 68 and end regions 70, 72. In one transformer embodiment rated at 30 MVA, end regions 70, 72 include 24 turns (12 at each end) of conductor while 51 turns of current limiting wire are provided for central regions 66, 68.

Figure 10:
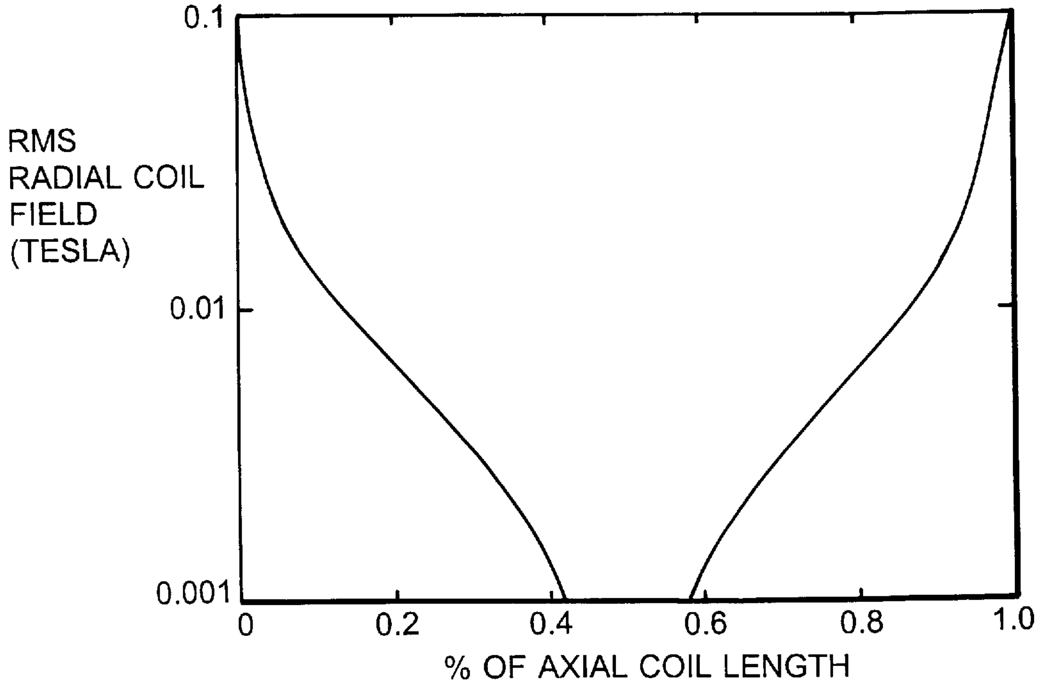
FIG. 10 is a plot showing the RMS radial coil field as a function of the percent of the axial coil length.

Referring to FIG. 10, a plot illustrating the RMS radial coil field (units of Tesla) as a function of the percent of the axial length of the coil, indicates that the radial magnetic field is almost nonexistent at the central region of the coils and increases dramatically at end regions. Thus, the current limiting wire in wire in monolithic form is generally provided only in central regions 66, 68 where the radial magnetic field is low.

In the table below, the relative performance of a transformer with and without low loss end regions is shown. The AC losses of a transformer having end regions 14 with conductor 22 can be fabricated with a lower aspect ratio wire to somewhat lower the losses. The low aspect monolith case shown in Table 1, has a change in the aspect ratio of the end-windings of a factor of about four. Thus, for certain applications, the transformer may include a conductor 22 having a low aspect ratio monolith.

| | High voltage | Low voltage | units |
|---|---|---|---|
| PARAMETER | | | |
| current rating | 157 | 787 | amp |
| voltage rating | 110 | 20 | kilovolts |
| turns | 1500 | 300 | |
| layers | 20 | 4 | |
| total turns/layer | 75 | 75 | |
| AC turns/layer | 24 | 24 | |
| DC turns/layer | 51 | 51 | |
| PERFORMANCE | | | |
| Maximum radial field | 0.033 | 0.150 | tesla |
| Maximum axial field | 0.240 | 0.240 | tesla |
| AC heating without AC conductor | 7.2 | 15.0 | mW/amp-m |
| AC heating with AC conductor | 1.7 | 1.7 | mW/amp-m |

-continued

| | High voltage | Low voltage | units |
|---|---|---|---|
| AC heating with a low aspect ratio monolith replacing the AC turns. | 5.7 | 10.2 | mW/amp-m |

What is claimed is:

1. A method of providing a superconducting magnetic coil for generating a magnetic field that varies along a longitudinal axis of the coil, the coil comprising:

winding a first superconductor about the longitudinal axis of the coil, the first superconductor formed of an anisotropic superconducting material laminated onto a thermal stabilizing backing strip made of a conductive material and having a first resistivity characteristic in a normal state of operation;

winding a second superconductor about the longitudinal axis of the coil; and connecting to the first anisotropic superconductor, the second superconductor having a second resistivity characteristic, in a normal state of operation, less than the resistivity characteristic of the first anisotropic superconductor in a normal state of operation, wherein the first superconductor limits current flowing through the coil when the first superconductor is in the normal state of operation thereby limiting damage to the coil.

2. The method of claim 1 wherein the connecting step includes connecting second superconductor to an end of the first anisotropic superconductor and configuring the second superconductor to provide a low AC loss characteristic in the presence of perpendicular magnetic fields.

3. The method of claim 2 further comprising forming the second superconductor from an anisotropic superconducting material.

4. The method of claim 3 further comprising forming the first anisotropic superconductor from a superconductor tape.

5. The method of claim 4 further comprising forming the first anisotropic superconductor tape in monolithic form.

6. The method of claim 5 further comprising forming the monolithic-form first anisotropic superconductor tape in the form of a monofilament superconductor.

7. The method of claim 5 wherein the monolithic-form first anisotropic superconductor tape is includes a multifilament composite superconductor having individual superconducting filaments which extend the length of the multifilament composite superconductor.

8. The method of claim 7 wherein the first resistivity characteristic, in its normal state, in a range between about 10 to 50 $\mu\Omega$-cm.

9. The method of claim 4 wherein the superconductor tape has an aspect ratio in a range between about 200:1 and 500:1.

10. The method of claim 1 wherein the backing strip has a resistivity characteristic greater than about 10 $\mu\Omega$-cm.

11. The method of claim 3 further comprising forming the second anisotropic superconductor as a superconductor tape.

12. The method of claim 11 wherein the superconductor tape of the second anisotropic superconductor includes a multifilament composite superconductor having individual superconducting filaments which extend the length of the multifilament composite superconductor and are surrounded by a matrix forming material.

13. The method of claim 12 wherein the individual superconducting filaments of the second anisotropic superconductor are twisted.

14. The method of claim 3 wherein winding the first superconductor includes winding in a layered configuration.

15. The method of claim 3 wherein the first superconductor is formed of pancake coils each coil electrically connected to an adjacent coil.

16. The method of claim 15 wherein the first superconductor is formed of double pancake coils.

17. The method of claim 3 wherein winding the second superconductor includes winding the second superconductor into a pancake coil.

18. The method of claim 14 wherein winding the second superconductor includes winding the second superconductor into a pancake coil.

19. The method of claim 15 wherein winding the second anisotropic superconductor includes winding the second superconductor into a pancake coil.

20. The method of claim 3 wherein a first segment of the first superconductor extends along the longitudinal axis in a first direction toward the second superconductor and connects to a first end of a first segment of the second superconductor at a first junction, a second end of the first segment connected to a second segment of the first superconductor, the second segment extending along the longitudinal axis in second direction way from the second superconductor.

21. The method of claim 3 wherein the first and second superconductors are high temperature superconductors.

22. The method of claim 3 wherein the first superconductor constitutes greater than 50% of the total amount of superconductor of the coil.

23. The method of claim 3 wherein the second superconductor constitutes a portion of the total amount of superconductor of the coil in a range between 5% and 30%.

24. The method of claim 23 wherein the second superconductor constitutes about 10% of the total amount of superconductor of the coil.

25. The method of claim 1 wherein the backing strip comprises a conductive metal.

26. A method of providing a superconducting magnetic coil for generating a magnetic field that varies along a longitudinal axis of the coil, the coil comprising:

winding a first anisotropic superconductor laminated onto a thermal stabilizing backing strip made of a conductive material about the longitudinal axis of the coil and forming the first anisotropic superconductor as a superconducting tape having a wide surface, the first anisotropic superconductor configured to provide a low AC loss characteristic in the presence of magnetic fields parallel to the wide surface of the superconductor tape; and winding a second superconductor, different from the first anisotropic superconductor about the longitudinal axis of the coil;

connecting the second superconductor to an end of the first anisotropic superconductor and configuring the second superconductor to provide a low AC loss characteristic in the presence of magnetic fields perpendicular to the wide surface of the superconductor tape of the first anisotropic superconductor, wherein the first superconductor limits a current flowing through the coil when the first superconductor is in a normal state of operation thereby limiting damage to the coil.

* * * * *